Sept. 16, 1958 E. R. R. BURMESTER 2,852,754

TWO TERMINAL ELECTRIC AMPLIFIER

Filed June 3, 1954 2 Sheets-Sheet 1

INVENTOR
Edgard Ricardo Rodriguez Burmester

BY Ann P. Teslof,
Attorney

INVENTOR,
Edgard Ricardo Rodriguez Burmester
BY
[signature]
Attorney

United States Patent Office 2,852,754

Patented Sept. 16, 1958

2,852,754

TWO TERMINAL ELECTRIC AMPLIFIER

Edgard Ricardo Rodriguez Burmester, Buenos Aires, Argentina, assignor to Svenska Aktiebolaget Gasaccumulator, Lidingo (near Stockholm), Sweden, a corporation of Sweden Application June 3, 1954, Serial No. 441,268

6 Claims. (Cl. 333—80)

This invention refers to two-terminal electric amplifiers with negative internal impedance, i. e. to electric devices which, being provided with solely one pair of connector terminals, are capable of amplifying electric currents and/or voltages in both directions in that electric circuit for instance a transmission line to which this pair of connector terminals is coupled.

As is known, the electric amplifiers of common design are four-terminal networks with one pair of terminals corresponding to the input end while the other pair of terminals corresponds to the output end of the amplifier, so that in use these amplifiers must be inserted into the electric circuit in which it is desired to obtain the amplification, and for each direction of amplification a separate amplifier must be used. In the case of transmission lines, the conductors of the line must be interrupted and two amplifiers each for one direction of transmission, are combined in parallel by means of hybrid transformers and are connected in series with the line.

In contradistinction to this, the sole pair of connector terminals of the electric amplifier according to the present invention is simply coupled, either conductively or by means of one of the known coupling means, to two points of the electric circuit or network in which it is desired to obtain the amplification without interrupting the continuity of the network and provides simultaneously the amplification in both directions of the flow of electric currents in the network. If this network is an electric transmission line and if both conductors of the line must show electric symmetry with respect to earth potential, and if at the same time a short-circuit between these conductors must be avoided, any of the well-known coupling and adapter devices may be used between the transmission line and the pair of connector terminals of the amplifier according to the present invention, without affecting the operation of the amplifier.

Basically, the two-terminal electric amplifier according to the present invention is constituted of an amplifier portion of any conventional design which is coupled through at least one feedback circuit to a phase and/or amplitude and/or impedance adapter portion, the circuit arrangement being adjusted to a working point corresponding to a predetermined and stable value of positive feedback, capable of producing between the sole pair of connector terminals of the amplifier a negative impedance capable of compensating at least partially the positive impedance of that part of the electric circuit or line to which the connector terminals are connected and in which it is desired to obtain the current and/or voltage amplification.

When properly designed and adjusted, the two-terminal electric amplifier according to the present invention is capable of deriving from the network to which it is connected an electrical signal of reduced energy and of returning to the same point of the network, the same signal but with increased energy, without troublesome oscillations.

Thus, the main object of the present invention is to provide an amplifier having a sole pair of connector terminals which, when coupled to two adequate points of an electric circuit, is capable of amplifying the electric current and/or voltage occurring between these points.

A further object of the present invention is to provide a two-terminal electric amplifier capable of providing an amplified electric signal in both directions when connected in parallel with an electric transmission line.

Still another object of the present invention is to provide a two-terminal electric amplifier which can be used as an individual two-way amplifier in a telephone line.

A further object of the present invention is to provide a two-terminal amplifier capable of providing an amplified electric signal free of oscillations, independently of the fact whether the transmission line is open or short-circuited.

These and other objects and advantages will appear from the following detailed description of the present invention with reference to the accompanying drawings, wherein.

Figure 5:
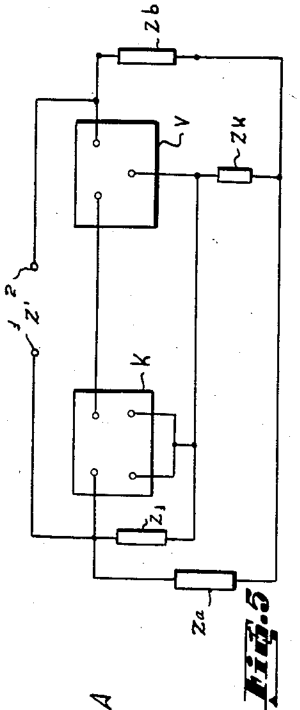
Figure 6:
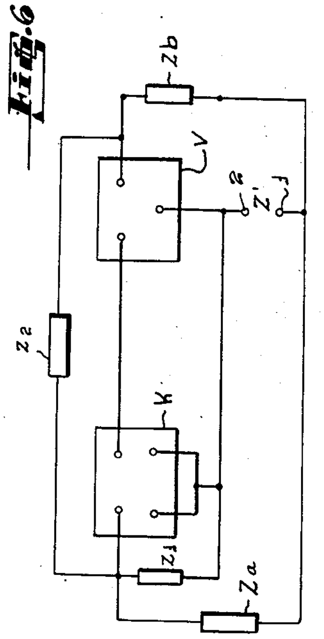
Figure 7:
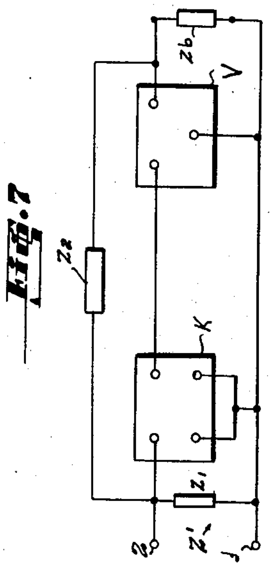
Figure 4:
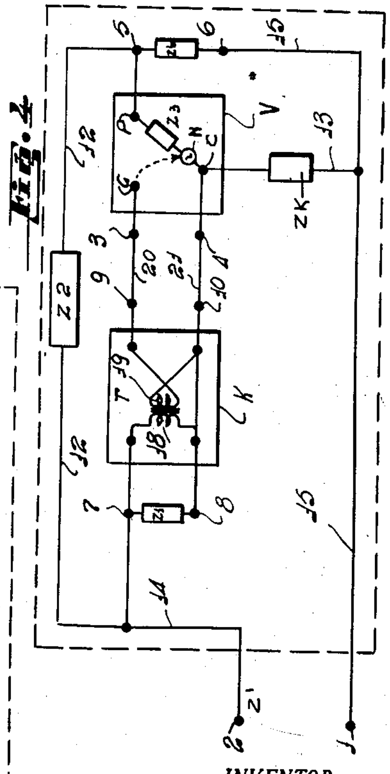
Fig. 4 is a schematic circuit diagram of a grid-coupled two-terminal electric amplifier according to the present invention including an electronic amplifier valve.
Figures 8, 9, 10, 11:
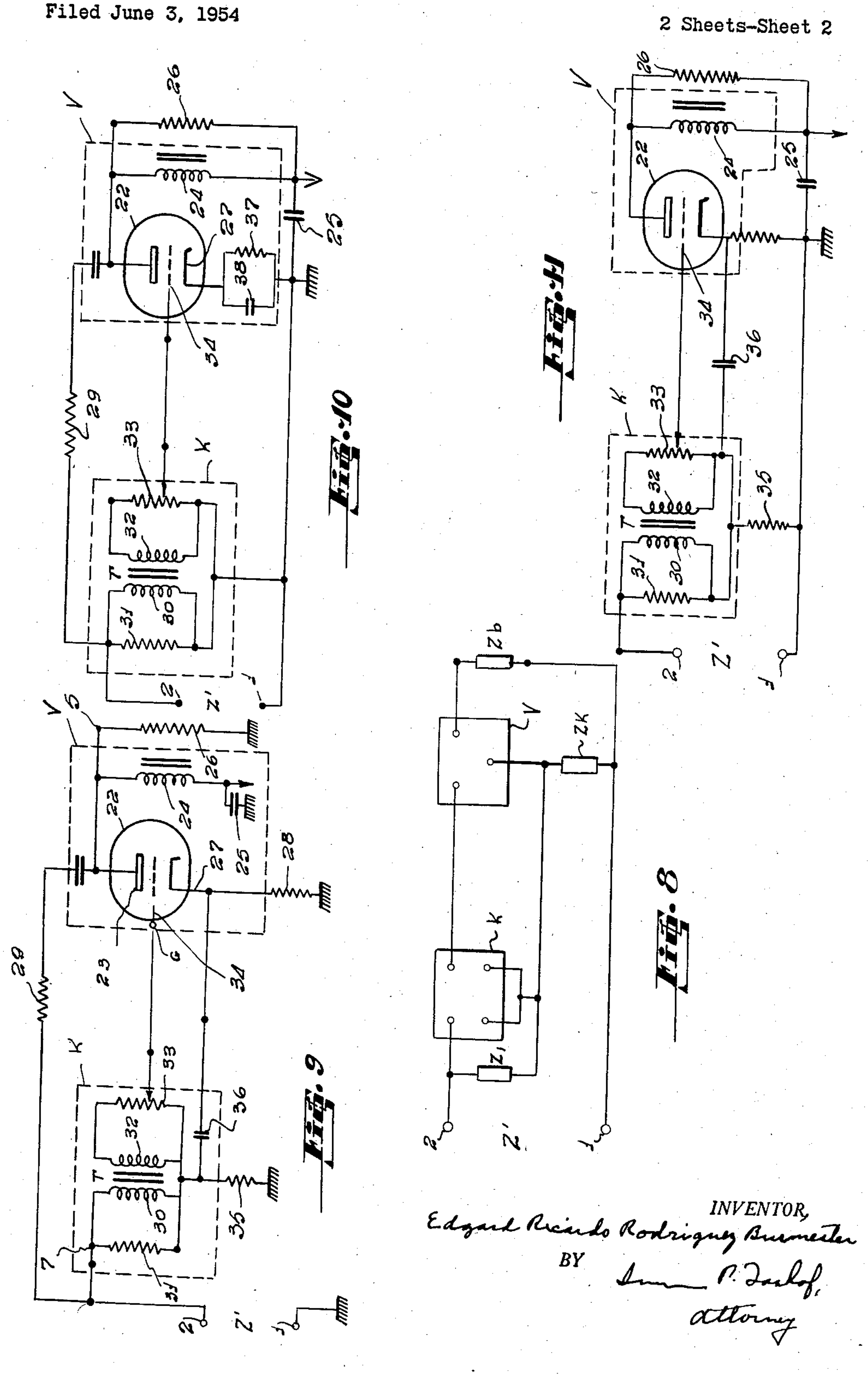

Figs. 5, 6, 7 and 8 are schematic circuit diagrams of different embodiments of the two-terminal amplifier shown in Fig. 4, and Figs. 9, 10 and 11 are detailed circuit diagrams of the two-terminal amplifiers shown in Figs. 4, 7 and 8, respectively.

In the figures, the same reference characters and numerals indicate like or corresponding parts or elements.

It has been mentioned hereinbefore that the two-terminal electric amplifier according to the present invention is designed in such a manner that between the sole pair of connector terminals there is created a negative impedance capable of compensating at least in part, the positive impedance of that part of the electric network to which the connector terminals are coupled and in which it is desired to obtain the current and/or voltage amplification. For a better understanding of the effect of the negative impedance which is established between the connector terminals of the amplifier according to the present invention, I include hereinbelow a concise theoretical explanation for the circuit diagram of Figs. 1 and 2, for solely positive magnitudes.

Figure 1:
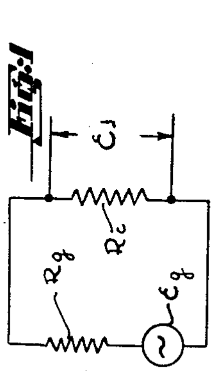

Let it be assumed that an electric circuit, as shown in Fig. 1, comprises a source of an electromotive force $E_g$ having an internal resistance $R_g$, which is connected to a load resistance $R_c$ over which there is generated a voltage $E_1$. The value of $E_1$ is determined by the following equation:

$$E_1=E_g\frac{Rc}{R_g+R_c}$$

and assuming that in this particular case:

$$R_c=R_g=600 \text{ ohm}$$

one obtains:

$$E_1=E_g\frac{600}{600+600}=\frac{1}{2}E_g$$

i. e. a circuit in which the load resistance $R_c$ is equal to the internal resistance $R_g$ of the generator, the voltage $E_1$ obtained on load resistance $R_c$ is half of the electromotive force $E_g$.

Figure 2:
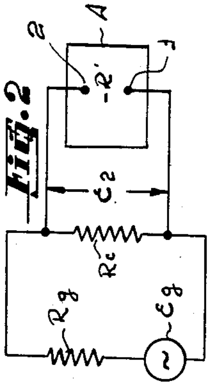
Figs. 1 and 2 are schematic circuit arrangements explicative of the theory underlying the present invention.

Let it be assumed now that as shown in Fig. 2, a two-terminal electric amplifier A according to the present invention having a negative resistance R′ between its connector terminals 1 and 2 is connected in parallel with load resistance $R_c$, thus obtaining between the ends of the parallel combination of $R_c$ and R′, a voltage $E_2$. The magnitude of $E_2$ is determined by the following formula:

$$E_2=E_g\frac{\frac{R_c(-R')}{R_c-R'}}{R_g+\frac{R_c(-R')}{R_c-R'}}=E_g\frac{-R_gR'}{R_gR_c-(R_g+R_c)R'}$$

and assuming that in the case under consideration R′=500 ohm, one obtains:

$$E_2=E_g\frac{-600\times 500}{600\times 600-(600+600)500}$$

$$=E_g\frac{-30}{36-60}=E_g\frac{30}{24}=\frac{5}{4}E_g$$

When voltage $E_2$ is compared with voltage $E_1$ i. e. on applying a negative resistance to the circuit, we obtain:

$$\frac{E_2}{E_1}=\frac{\frac{5}{4}E_g}{\frac{1}{2}E_g}=\frac{10}{4}=2.5$$

$$E_2=2.5E_1$$

This signifies that in the particular case under consideration, when two-terminal electric amplifier A according to the present invention is applied to the circuit of Fig. 1, a voltage amplification of two and a half times is obtained with respect to the original voltage.

For the calculation of the current and power the same criterion and the general concepts of electrotechnics are valid.

As regards the conditions of operative stability of an electric circuit to which there has been applied a two-terminal electric amplifier according to the present invention, the same can be easily deduced by one skilled in the art and are as follows:

Any electric circuit the positive resistance of which is compensated completely by a negative resistance (which also depends on the reactive magnitudes), theoretically reaches a condition of oscillation, as can be shown for the example under consideration, in which, if a negative resistance of 300 ohm is applied thereto, with all other magnitudes being equal:

$$E_2=E_g\frac{-R_cR'}{R_gR_c-(R_g+R_c)R'}=$$

$$E_g\frac{-600\times 300}{600\times 600-(600+600)300}=$$

$$E_g\frac{-18}{36-12-3}=E_g\frac{-18}{36-46}=E_g\frac{-18}{0}$$

so that, $E_2$ approaches infinity when R′ approaches 300 ohm, i. e. the circuit approaches the oscillatory condition. Therefore, the two-terminal amplifier according to the present invention, if not properly calculated and designed, may provoke the oscillation of the circuit to which it is connected.

The formulas for correctly designing the two-terminal electric amplifier according to the present invention will be given hereinbelow with reference to the circuit arrangements of Figs. 3 and 4 both corresponding to two-terminal electric amplifiers comprising an electronic amplifier valve, but while in the first the pair of connector terminals is coupled to the anode of the amplifier valve, in the latter the connector terminals are coupled to the grid of the same valve. However, it should be mentioned that the location of the sole pair of terminals in the electric amplifier according to the present invention is merely a question of convenience, since the same can be substituted for any of various feedback impedances of the circuit arrangement without affecting the operation of the respective amplifier, as will be explained hereinafter.

Figure 3:
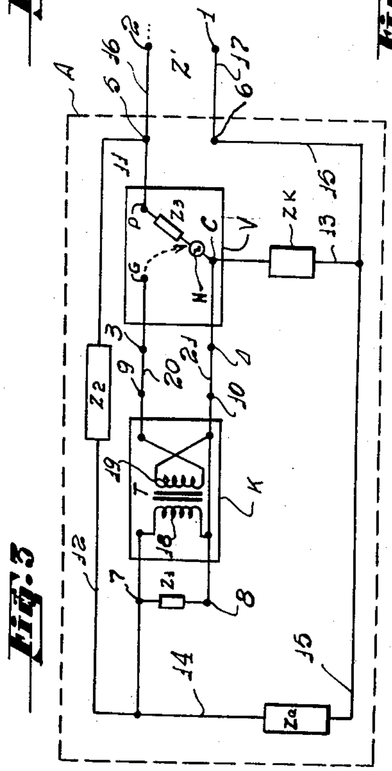
Fig. 3 is a schematic circuit diagram of an anode-coupled two-terminal electric amplifier according to the present invention including an electronic amplifier valve.

As can be observed in Figs. 3 and 4, two-terminal electric amplifier A according to the present invention comprises basically a unidirectional amplifier portion represented schematically by a network V having a pair of input terminals 3 and 4 and related with a pair of output terminals 5 and 6, a four-terminal phase and/or amplitude and/or impedance adapter portion K having a pair of input terminals 7 and 8 and a pair of output terminals 9 and 10 connected directly to input terminals 3 and 4, respectively, of amplifier portion V, a feedback impedance $Z_2$ connected in a parallel feedback circuit arrangement between the output of amplifier portion V and the input of adapter portion K, a second feedback impedance $Z_k$ connected in a series feedback circuit arrangement with respect to adapter portion K and amplifier portion V, a feedback adjusting impedance $Z_1$ connected across the input terminals of adapter portion K, a further feedback adjusting impedance $Z_a$ or $Z_b$ coupled to said adapter and to said amplifier portions respectively, and a set of connector terminals 1 and 2 connected to said feedback circuit arrangements in substitution of one of said impedances, the various feedback circuit arrangements being conditioned so that between connector terminals 1 and 2 there is created a negative impedance capable of compensating at least in part, the positive impedance of the circuit portion to which the connector terminals are coupled.

Referring now more particularly to two-terminal electric amplifier A of Fig. 3, feedback adjusting impedance $Z_a$ is connected to the input side of adapter portion K of the amplifier, while connector terminals 1 and 2 are coupled to the output side of unidirectional amplifier portion V, the latter being constituted by an electronic amplifier valve shown schematically within the rectangle corresponding to V by means of terminals marked with the letters G, P and C corresponding to the grid, anode and cathode, respectively of this valve, $Z_3$ representing the internal plate impedance, while N is the equivalent plate electromotive force of the valve.

More in particular, anode P of the amplifier valve is coupled to output terminal 5 of amplifier portion V by means of a conductor 11, the same terminal being connected, through conductor 12 and feedback impedance $Z_2$, to input terminal 7 of adapter portion K. As already mentioned hereinbefore, a feedback adjusting impedance $Z_1$ is connected between input terminals 7 and 8 of adapter portion C. Terminal *k* of amplifier portion V is connected to output terminal 6 of amplifier portion V through feedback adjusting impedance $Z_k$ and conductor 13. Feedback adjusting impedance $Z_a$ is connected at one end to input terminal 7 of adapter portion K by means of conductor 14, while the opposite end thereof is coupled to connector terminal 6 of amplifier A and one end of impedance $Z_k$ through conductor 15. Output terminals 5 and 6 of amplifier portion V are connected to connector terminals 2 and 1 of two-terminal amplifier A through conductors 16 and 17, respectively.

Adapter portion K is constituted in the embodiment of Fig. 3 by a phase inverter transformer T having a primary winding 18 connected directly to input terminals 7 and 8, and a secondary winding 19 connected in a phase-inverting arrangement to output terminals 9 and 10 of adapter portion K, these output terminals 9 and 10 being connected directly to input terminals 3 and 4 of amplifier portion V, respectively, by means of conductors 20 and 21, respectively.

Input terminal 3 of amplifier portion V is coupled to grid G of the electronic valve forming part of amplifier portion V.

In the two-terminal electric amplifier according to the present invention and shown schematically in Fig. 3, the impedance Z′ between connector terminals 1 and 2 is determined by the following formula:

$$Z'=\frac{Z_aZ_2(Z_3+Z_k)+(Z_a+Z_2)[Z_1Z_3+(Z_1+Z_3)Z_k]-\mu Z_1(Z_a+Z_2)Z_k}{Z_1(Z_2+Z_3)+(Z_a+Z_k)(Z_1+Z_2+Z_3)-\mu Z_1(Z_a+Z_k)}$$

This expression yields negative impedance values when:

$$\{Z_aZ_2(Z_3+Z_k)+(Z_a+Z_2)[Z_1Z_3+(Z_1+Z_3)Z_k]\}>\mu Z_1(Z_a+Z_2)Z_k$$

and $$\{Z_1(Z_2+Z_3)+(Z_a+Z_k)(Z_1+Z_2+Z_3)\}<\mu Z_1(Z_a+Z_k)$$

or when:

$$\{Z_aZ_2(Z_3+Z_k)+(Z_a+Z_2)[Z_1Z_3+(Z_1+Z_3)Z_k]\}<\mu Z_1(Z_a+Z_2)Z_k$$

and $$\{Z_1(Z_2+Z_3)+(Z_a+Z_k)(Z_1+Z_2+Z_3)\}>\mu Z_1(Z_a+Z_k)$$

The circuit layout of the two-terminal electric amplifier shown in Fig. 4, is the same as that of Fig. 3 with the sole difference that a feedback adjusting impedance $Z_b$ is now connected between output terminals 5 and 6 related with amplifier portion V, while connector terminals 1 and 2 are connected to the input side of adapter portion K, so that these connector terminals occupy the place of feedback adjusting impedance $Z_a$ of Fig. 3, while feedback adjusting impedance $Z_b$ occupies the place of connector terminals 1 and 2 of Fig. 3.

The impedance Z′ which exists between connector terminals 1 and 2 of the two-terminal electric amplifier shown in Fig. 4 is determined by the following formula:

$$Z'=\frac{(Z_1+Z_k)Z_2Z_b+[Z_1Z_3+(Z_1+Z_3)Z_k](Z_2+Z_b)-\mu Z_1(Z_2+Z_b)Z_k}{(Z_1+Z_2)Z_3+(Z_1+Z_2+Z_3)(Z_k+Z_b)-\mu Z_1(Z_k+Z_b)}$$

This expression yields negative impedance values when:

$$\{(Z_1+Z_k)Z_2Z_b+[Z_1Z_3+(Z_1+Z_3)Z_k](Z_2+Z_b)\}>\mu Z_1(Z_2+Z_b)Z_k$$

and $$\{(Z_1+Z_2)Z_3+(Z_1+Z_2+Z_3)(Z_k+Z_b)\}<\mu Z_1(Z_k+Z_b)$$

or when $$\{(Z_1+Z_k)Z_2Z_b+[Z_1Z_3+(Z_1+Z_3)Z_k](Z_2+Z_b)\}<\mu Z_1(Z_2+Z_b)Z_k$$

and $$\{(Z_1+Z_2)Z_3+(Z_1+Z_2+Z_3)(Z_k+Z_b)\}>\mu Z_1(Z_k+Z_b)$$

It has been explained hereinbefore that in order to achieve the desired results, the internal impedance between both connector terminals of the amplifier according to the present invention must be negative if the same is to operate in the desired manner and that the values of the various impedances must be calculated using the formulas given hereinabove. Evidently the values of several of the impedances mentioned in these formulas will be determined by the nature of the circuit elements used, for instance $Z_3$ will depend on the type of amplifier valve used in unidirectional amplifier portion V, or represents the internal impedance of any conventional amplifier used. Impedance $Z_1$ may be the reflected internal input impedance of adapter portion K or a complementary impedance for this internal input impedance, when it is desired to obtaitn a predetermined impedance between the input terminals of adapter portion K.

It should be noted that one of the fundamental properties of the two-terminal amplifier according to the present invention is that the same can oscillate only when the positive impedance of the circuit, to which the amplifier is connected, is equal to the internal negative impedance, i. e. when the external and internal resistance are of like magnitudes and the external and internal reactances are conjugate and also of equal magnitudes.

When the values of the positive impedance of the circuit, to which the two-terminal amplifier is applied, differ slightly from the internal negative impedance of the amplifier, the latter cannot oscillate; only the amplification, which is being provided by the amplifier decreases with an increase of the difference between the positive and negative impedances or, in other words, between the external and internal impedances. This means that, by adequately selecting the values of the two-terminal electric amplifier according to the present invention, the latter cannot oscillate, and this neither when there exists a short circuit (zero impedance) nor when the circuit is open (infinite impedance) between connector terminals 1 and 2 of amplifier A.

This fundamental property of the two-terminal amplifier according to the present invention signifies that there will exist amplification when the impedance as seen from the amplifier, i. e. the positive impedance of the circuit to which it is connected, is that corresponding to the precalculated magnitude. If this were not the case, the amplification is reduced and the amplifier may even oscillate. The limits of the internal impedance values with respect to the external impedance, for which the amplifier might enter into oscillation, can be considerably reduced by adequately selecting the magnitudes of the circuit components.

Disregarding for the moment that the numerical values of the different components must be chosen in accordance with the respective formula, the plate connected two-terminal electric amplifier of Fig. 3 differs from the grid-connected two-terminal amplifier of Fig. 4 only as regards the position of the pair of connector terminals 1 and 2 and the use of second feedback adjusting impedances $Z_a$ and $Z_b$, respectively. More in particular, while in the plate-connected two terminal electric amplifier of Fig. 3, connector terminals 1 and 2 are coupled to the anode of the amplifier valve forming part of amplifier portion V, and second feedback adjusting impedance $Z_a$ is coupled to the input side of adapter portion K, in the two-terminal amplifier shown in Fig. 4, connector terminals 1 and 2 are coupled to the input side of adapter portion K, while second feedback adjusting impedance $Z_b$ is coupled to the anode of the amplifier valve. In all other aspects both circuit arrangements are alike, so that for the purposes of the present invention it will be sufficient to describe only one of these variations. This will be done with reference to the two-terminal amplifier of Fig. 4 which is the so-called grid-connected prototype, since connector terminals 1 and 2 are coupled, through the adapter portion K, to the grid of the amplifier valve forming part of amplifier portion V.

However, it should be noted that connector terminals 1 and 2 can be connected as shown schematically in Fig. 5 which represents the so-called plate-grid connected amplifier, in which internal impedance Z′ of the amplifier substitutes the first feedback impedance $Z_2$. A further modification is possible by suppressing second feedback impedance $Z_k$ and connecting the connector terminals 1 and 2 to the respective points of the circuit arrangement, as shown in Fig. 6.

On the other hand, when the characteristics of the circuit, to which the two-terminal amplifier according to the invention is applied, are such that there cannot occur an interruption or a short circuit in the same (infinite, respectively zero impedance), the circuitry of the two-terminal amplifier according to the present invention can be simplified as follows:

When the impedance of the circuit, to which the two-terminal amplifier is connected can never reach infinity, except when the circuit fails, the series feedback impedance $Z_k$ (current feedback) can be omitted, as shown in the schematic circuit diagram of Fig. 7.

When the impedance of the circuit, to which the two-terminal amplifier according to the present invention is connected can never be zero, except when the circuit fails, the parallel feedback impedance $Z_2$ (voltage feedback) can be omitted as shown in the schematic circuit diagram of Fig. 8.

Fig. 9 is a detailed circuit arrangement of a grid-connected two-terminal electric amplifier, in which the amplifier portion V is constituted by a triode 22 the anode 23 of which is connected in the usual manner through an inductor 24 to the positive pole of an anode supply source, not shown in the drawings. Inductor 24 is also connected to earth through capacitor 25. Anode 23 of triode 22 is also connected to earth through a resistor 26 which corresponds to second feedback adjusting impedance $Z_b$ of Fig. 4. Cathode 27 of triode 22 is connected to earth through a resistor 28 which corresponds to series feedback impedance $Z_k$ of Fig. 4, while anode 22 is also coupled to input terminal 7 of adapter portion K through a resistor 29 which corresponds to parallel feedback impedance $Z_2$.

Adapter portion K is constituted by a transformer T the primary winding 30 of which is connected in parallel with a resistor 31 corresponding to first feedback adjusting impedance $Z_1$, while secondary winding 32 of transformer T is connected in parallel with a potentiometer 33 the movable arm of which is connected to grid 34 of triode 22. The lower ends of transformer windings 30 and 32 are connected directly to one extreme of a resistor 35 and are coupled to cathode 27 of triode 22 through a coupling capacitor 36, while the other end of resistor 35 is connected to earth.

Connector terminal 2 of the two-terminal amplifier is connected directly to input terminal 7 of adapter K, while the other connector terminal 1 is connected to earth.

The operation of the circuit arrangement shown in Fig. 9 corresponds to that of Fig. 4.

Fig. 10 is a detailed circuit diagram of a grid-connected two-terminal electric amplifier according to the present invention, operating in a manner similar to that shown schematically in Fig. 7. As can be observed in the drawings, cathode 27 of triode 22 is connected to earth through a resistance 37 shunted by a capacitor 38, so that this amplifier does not comprise the series feedback impedance $Z_k$. In all other aspects the circuitry of the two-terminal amplifier shown in Fig. 10 is similar to that shown in Fig. 9, although it will be evident that the magnitudes of the various impedances will have different values.

Fig. 11 is a detailed circuit diagram of a further embodiment of a grid-connected two-terminal electric amplifier according to the present invention, based on schematic circuit diagram of Fig. 8. In this amplifier, the parallel feedback impedance $Z_2$ has been omitted.

While I have indicated and described several circuit arrangements for carrying my invention into effect, it will be apparent to one skilled in the art that my invention is by no means limited to the particular circuit shown and described, but that many modifications may be made without departing from the scope of my invention, as set forth in the appended claims.

What I claim is:

1. A two-terminal bidirectional electric amplifier having a sole pair of negative internal impedance input-output terminals comprising a four-terminal unidirectional amplifier portion having one input terminal, one output terminal and a common input-output terminal, a four-terminal electric magnitude adapter portion having one input terminal, one output terminal and a common input-output terminal, means to connect the output and common terminals of said adapter portion to the input and common terminals, respectively, of said amplifier portion, a parallel feedback impedance connected in a parallel feedback circuit arrangement between the output terminal of said amplifier portion and the input terminal of said adapter portion, a two-terminal first feedback adjusting impedance having one terminal connected to the input terminal of said adapter portion, a second two-terminal feedback adjusting impedance having one terminal connected to the output terminal of said amplifier portion, means to connect the free terminal of said first feedback adjusting impedance to the free terminal of said second feedback adjusting impedance, a series feedback impedance connected in a series feedback circuit arrangement between the common terminals of said adapter and amplifier portions and the interconnected free terminals of said first and second feedback adjusting impedances, and means connecting said negative internal impedance input-output terminals selectively in substitution of one of said feedback impedances.

2. A two-terminal electric amplifier having a sole pair of negative internal impedance input-output terminals according to claim 1, wherein said pair of output terminals is connected in substitution of said first feedback adjusting impedance.

3. A two-terminal electric amplifier having a sole pair of negative internal impedance input-output terminals according to claim 1, wherein said pair of output terminals is connected in substitution of said parallel feedback impedance.

4. A two-terminal electric amplifier having a sole pair of negative internal impedance input-output terminals according to claim 1, wherein said pair of output terminals is connected in substitution of said series feedback impedance.

5. A two-terminal electric amplifier having a sole pair of negative internal impedance input-output terminals according to claim 1, wherein said pair of negative internal impedance input-output terminals is connected in substitution of said second feedback adjusting impedance.

6. In combination, a two-terminal electric amplifier having a sole pair of negative internal impedance input-output terminals, comprising a unidirectional amplifier portion constituted of a triode amplifier valve having an anode, a control grid and a cathode and having an input terminal connected to said control grid, an output terminal connected to said anode and a common terminal connected to said cathode, a direct current supply source and means to connect said anode to the positive pole of said direct current supply source, an amplitude adapter portion constituted of a transformer formed of a primary winding and a secondary winding each shunted by a resistor and having an input terminal connected to one end of said primary winding, an output terminal connected to an intermediate point on said resistor connected across said secondary winding, and a common terminal connected to the other end of said primary winding and to one end of the said secondary winding, a conductor interconnecting the output terminal of said amplitude adapter with the input terminal of said amplifier portion and a coupling capacitor interconnecting the common terminal of said amplitude adapter portion with the common terminal of said unidirectional amplifier portion, a first resistor connected between the common terminal of said amplitude adapter portion and the negative pole of said supply source, a second resistor connected as a series feedback impedance between the cathode of said triode valve and the negative pole of said supply source, a third resistor connected as a second feedback adjusting impedance between the output terminal of said triode amplifier portion and the negative pole of said supply source, a fourth resistor connected as a parallel feedback impedance between the output terminal of said amplifier portion and the input terminal of said amplitude adapter portion, one of said pair of negative internal impedance input-output terminals being connected directly to the input terminal of said amplitude adapter portion, while the other terminal of said pair is connected to the negative pole of said supply source.

References Cited in the file of this patent

UNITED STATES PATENTS

| | | |
|---|---|---|
| 2,131,393 | Stillwell | Sept. 27, 1938 |
| 2,137,696 | Mouradian | Nov. 22, 1938 |
| 2,143,386 | Roberts | Jan. 10, 1939 |
| 2,569,347 | Shockley | Sept. 25, 1951 |

UNITED STATES PATENT OFFICE

CERTIFICATE OF CORRECTION

Patent No. 2,852,754 September 16, 1958

Edgard Ricardo Rodriguez Burmester

It is hereby certified that error appears in the above numbered patent requiring correction and that the said Letters Patent should read as corrected below.

In the grant, lines 2 to 4, strike out "assignor to Svenska Aktiebolaget Gasaccumulator, of Lidingo (near Stockholm), Sweden, a corporation of Sweden,"; line 13, for "Svenska Aktiebolaget Gasaccumulator, its successors" read -- Edgard Ricardo Rodriguez Burmester, his heirs --; in the heading to the printed specification, lines 4 to 6, strike out ", assignor to Svenska Aktiebolaget Gasaccumulator, Lidingo (near Stockholm), Sweden, a corporation of Sweden".

Signed and sealed this 10th day of March 1959.

(SEAL)

Attest:

KARL H. AXLINE

Attesting Officer

ROBERT C. WATSON

Commissioner of Patents